(12) United States Patent
Lai et al.

(10) Patent No.: US 9,312,009 B2
(45) Date of Patent: Apr. 12, 2016

(54) NON-VOLATILE MEMORY AND ASSOCIATED MEMORY ARRAY, ROW DECODER, COLUMN DECODER, WRITE BUFFER AND SENSING CIRCUIT

(71) Applicant: eMemory Technology Inc., Hsin-Chu (TW)

(72) Inventors: Tzu-Neng Lai, Nantou County (TW); Chih-Hao Huang, Taichung (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/592,477

(22) Filed: Jan. 8, 2015

(65) Prior Publication Data

US 2016/0012894 A1    Jan. 14, 2016

Related U.S. Application Data

(60) Provisional application No. 62/022,166, filed on Jul. 8, 2014.

(51) Int. Cl.
*G11C 7/00* (2006.01)
*G11C 16/08* (2006.01)
(Continued)

(52) U.S. Cl.
CPC ............... *G11C 16/08* (2013.01); *G11C 16/10* (2013.01); *G11C 16/26* (2013.01); *G11C 17/04* (2013.01); *G11C 17/08* (2013.01); *G11C 17/16* (2013.01); *G11C 17/18* (2013.01); *H01L 23/528* (2013.01); *H01L 27/0629* (2013.01); *H01L 27/11206* (2013.01); *H01L 27/11524* (2013.01); *H01L 29/1079* (2013.01); *H01L 29/4916* (2013.01); *H01L 29/93* (2013.01); *H03K 3/356182* (2013.01); *H01L 23/5252* (2013.01)

(58) Field of Classification Search
CPC ...... G11C 7/1045; G11C 16/30; G11C 29/26; G11C 29/021; G11C 2029/1204
USPC ............... 365/189.09, 201, 203, 222, 230.06, 365/230.08, 189.14, 63
See application file for complete search history.

(56) References Cited

U.S. PATENT DOCUMENTS

| 5,594,692 | A  | * | 1/1997 | Yamaguchi | ............ | G11C 16/30 |
|           |    |   |        |           |              | 365/185.28 |
| 7,190,615 | B2 | * | 3/2007 | Fujito    | ...................... | G11C 7/18 |
|           |    |   |        |           |              | 365/185.05 |

(Continued)

FOREIGN PATENT DOCUMENTS

EP          0212451          3/1987

*Primary Examiner* — Gene Auduong
(74) *Attorney, Agent, or Firm* — WPAT, P.C.; Justin King (57) ABSTRACT

A non-volatile memory includes a memory array, a row decoder, a column decoder, a write buffer and a sensing circuit. The column decoder includes a programming decoder and a reading decoder. The programming decoder is connected with n bit lines of the memory array. The reading decoder is connected with the n bit lines. During a program cycle, a programming control signal set is activated. Consequently, the programming decoder determines a selected memory cell, and a cell current generated by the selected memory cell flows to the write buffer through the programming decoder and a programming data line. During a read cycle, a reading control signal set is activated. Consequently, the reading decoder determines the selected memory cell, and the cell current generated by the selected memory cell flows to the sensing circuit through the reading decoder and a reading data line.

16 Claims, 7 Drawing Sheets

(51) Int. Cl.

| | |
|---|---|
| *G11C 17/16* | (2006.01) |
| *G11C 17/18* | (2006.01) |
| *H01L 27/112* | (2006.01) |
| *G11C 16/10* | (2006.01) |
| *G11C 16/26* | (2006.01) |
| *G11C 17/04* | (2006.01) |
| *G11C 17/08* | (2006.01) |
| *H01L 23/528* | (2006.01) |
| *H01L 27/06* | (2006.01) |
| *H01L 29/10* | (2006.01) |
| *H01L 29/49* | (2006.01) |
| *H01L 29/93* | (2006.01) |
| *H01L 27/115* | (2006.01) |
| *H03K 3/356* | (2006.01) |
| *H01L 23/525* | (2006.01) |

(56) References Cited

U.S. PATENT DOCUMENTS 8,264,872 B2    9/2012   De Sandre et al.
2007/0038919 A1*   2/2007   Sekiguchi ............ G06F 11/1044
                                                                                     714/763

* cited by examiner

NON-VOLATILE MEMORY AND ASSOCIATED MEMORY ARRAY, ROW DECODER, COLUMN DECODER, WRITE BUFFER AND SENSING CIRCUIT

This application claims the benefit of U.S. provisional application Ser. No. 62/022,166, filed Jul. 8, 2014, the subject matter of which is incorporated therein by reference.

FIELD OF THE INVENTION

The present invention relates to a column decoder for a non-volatile memory, and more particularly to a column decoder for a non-volatile memory so as to achieve high speed read sensing capability.

BACKGROUND OF THE INVENTION

Figure 1A:
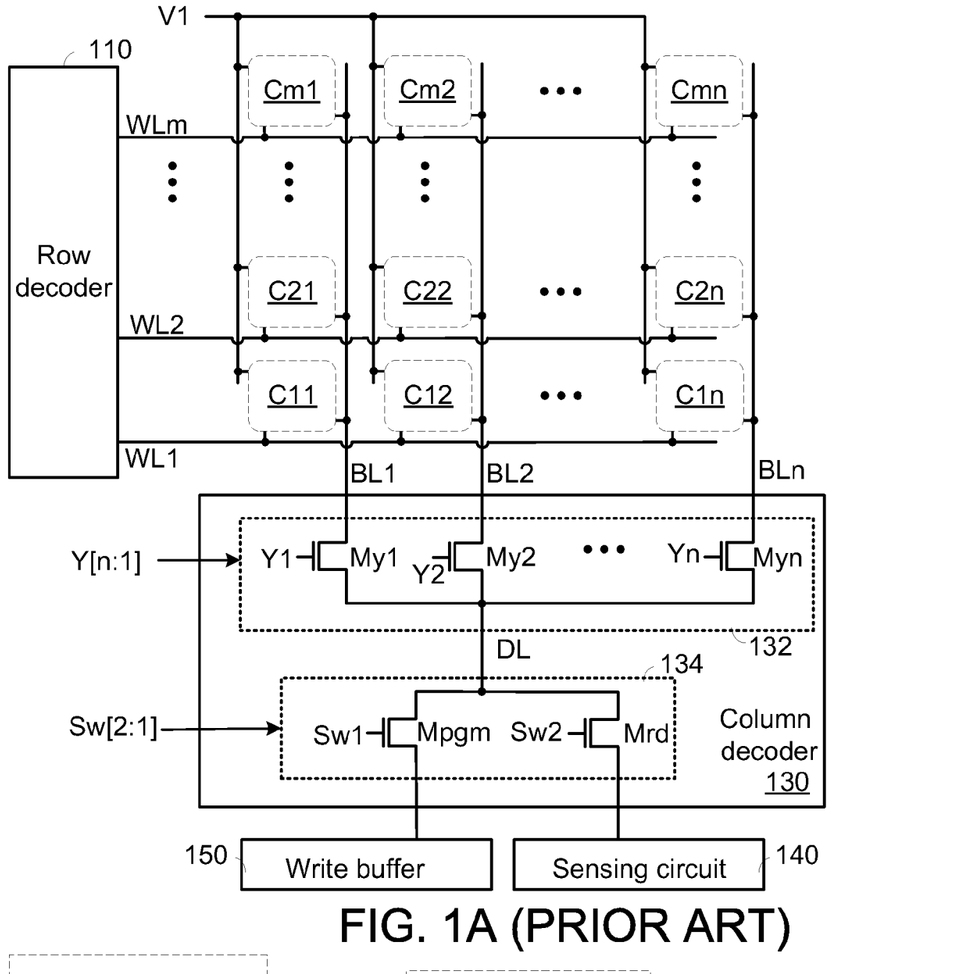
FIG. 1A (prior art) is a schematic circuit diagram illustrating a conventional non-volatile memory.
Figure 1B:
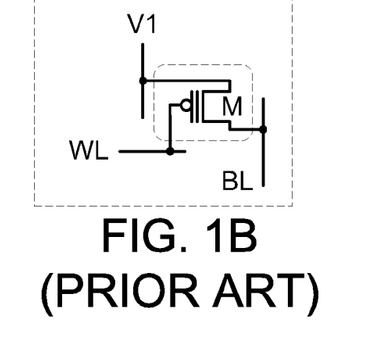
FIG. 1B (prior art) is a schematic circuit diagram illustrating a memory cell of a MTP memory.
Figure 1C:
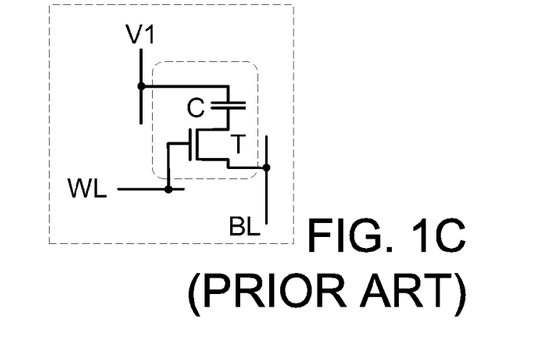
FIG. 1C (prior art) is a schematic circuit diagram illustrating a memory cell of an OTP memory.

FIG. 1A is a schematic circuit diagram illustrating a conventional non-volatile memory. FIG. 1B is a schematic circuit diagram illustrating a memory cell of a MTP memory. FIG. 1C is a schematic circuit diagram illustrating a memory cell of an OTP memory. As shown in FIG. 1A, the non-volatile memory comprises a memory array, a row decoder 110, a column decoder 130, a write buffer 150 and a sensing circuit 140. The row decoder 110 is connected with m word lines WL1~WLm. The column decoder 130 is connected with n bit lines BL1~BLn. The memory array comprises m×n memory cells C11~Cmn. Moreover, the memory array is connected with the m word lines WL1~WLm, the n bit lines BL1~BLn and a voltage source V1.

Generally, the working state of the memory array may be at least divided into a program cycle and a read cycle. During the program cycle, a selected memory cell is determined by the row decoder 110 and the column decoder 130, and the voltage value of the voltage source V1 is correspondingly adjusted. Consequently, a program action of the selected memory cell is performed. Similarly, under control of the row decoder 110 and the column decoder 130, the program actions of more selected memory cells are sequentially performed. After the program actions of all selected memory cells are completed, the program cycle is ended.

After the program cycle, each memory cell is in either a first storing state (e.g. the storing state "0") or a second storing state (e.g. the storing state "1").

During the read cycle, a selected memory cell is determined by the row decoder 110 and the column decoder 130, and the voltage value of the voltage source V1 is correspondingly adjusted. Consequently, a read action of the selected memory cell is performed, and the storing state of the selected memory cell is determined. Similarly, under control of the row decoder 110 and the column decoder 130, the read actions of more selected memory cells are sequentially performed. After the read actions of all selected memory cells are completed, the read cycle is ended.

As shown in FIG. 1A, the column decoder 130 comprises a column decoding circuit 132 and a switching circuit 134. The column decoder 130 is operated according to a column control signal set Y[n:1] and a switch control signal set Sw[2:1]. The column control signal set Y[n:1] contains n column control signals from the first column control signal Y1 to the n-th column control signal Yn. The switch control signal set Sw[2:1] contains a first switch control signal Sw1 and a second switch control signal Sw2.

The column decoding circuit 132 comprises n switch transistors My1~Myn. According to the column control signal set Y[n:1], one of the n switch transistors My1~Myn is in a close state but the others of the n switch transistors My1~Myn are in an open state.

The switching circuit 134 comprises two switch transistors Mpgm and Mrd. According to the switch control signal set Sw[2:1], one of the two switch transistors Mpgm and Mrd is in the close state but the other switch transistor is in the open state.

During the program cycle, the row decoder 110 activates a word line to determine a selected row of n memory cells. Moreover, according to the column control signal set Y[n:1], the column decoding circuit 132 of the column decoder 130 determines a selected memory cell from the selected row of n memory cells. Then, according to the switch control signal set Sw[2:1], the switching circuit 134 of the column decoder 130 controls the switch transistors Mpgm and Mrd to be in the close state and the open state, respectively. Consequently, during the program cycle, a cell current generated by the selected memory cell flows to the write buffer 150.

During the read cycle, the row decoder 110 activates a word line to determine a selected row of n memory cells. Moreover, according to the column control signal set Y[n:1], the column decoding circuit 132 of the column decoder 130 determines a selected memory cell from the selected row of n memory cells. Then, according to the switch control signal set Sw[2:1], the switching circuit 134 of the column decoder 130 controls the switch transistors Mpgm and Mrd to be in the open state and the close state, respectively. Consequently, during the read cycle, the cell current generated by the selected memory cell flows to the sensing circuit 140. Then, the sensing circuit 140 determines the storing state of the selected memory cell according to the cell current.

Hereinafter, a process of programming the memory cell C22 and a process of reading the memory cell C22 will be illustrated as examples. During the program cycle, the row decoder 110 activates the word line WL2 to determine a selected row of n memory cells C21~C2n. Moreover, if the second column switch signal Y2 is activated but the other column switch signals Y1 and Y3~Yn are inactivated, only the switch transistor My2 is in the close state but the other switch transistors My1 and My3~Myn are in the open state under control of the column decoding circuit 132 of the column decoder 130. Consequently, the memory cell C22 is the selected memory cell. Moreover, since the first switch control signal Sw1 is activated and the second switch control signal Sw2 is inactivated, the switching circuit 134 of the column decoder 130 controls the switch transistors Mpgm and Mrd to be in the close state and the open state, respectively. Consequently, during the program cycle, the cell current generated by the selected memory cell C22 flows to the write buffer 150. Meanwhile, the program action of the selected memory cell C22 is completed.

During the read cycle, the row decoder 110 activates the word line WL2 to determine a selected row of n memory cells C21~C2n. Moreover, if the second column switch signal Y2 is activated but the other column switch signals Y1 and Y3~Yn are inactivated, only the switch transistor My2 is in the close state but the other switch transistors My1 and My3~Myn are in the open state under control of the column decoding circuit 132 of the column decoder 130. Consequently, the memory cell C22 is the selected memory cell. Moreover, since the first switch control signal Sw1 is activated and the second switch control signal Sw2 is inactivated, the switching circuit 134 of the column decoder 130 controls the switch transistors Mpgm and Mrd to be in the open state and the close state, respectively. Consequently, during the read cycle, the cell current generated by the selected memory cell C22 flows to the sensing circuit 140. Then, the sensing circuit 140 determines the storing state of the selected memory cell according to the cell current.

Generally, according to the number of times the non-volatile memory is programmed, the non-volatile memories may be classified into a multi-time programming memory (also referred as a MTP memory) and a one time programming memory (also referred as an OTP memory). The above column decoder 130 may be applied to the MTP memory or the OTP memory.

The configuration of the memory cell for the MTP memory, is shown in FIG. 1B. As shown in FIG. 1B, the memory cell comprises a floating gate transistor M. A control gate of the floating gate transistor M is connected with the word line WL. The drain terminal of the floating gate transistor M is connected with the bit line BL. The source terminal of the floating gate transistor M is connected with the voltage source V1.

During the program cycle, the storing state of the memory cell is determined according to the amount of the hot carriers stored in the floating gate of the floating gate transistor M. For example, if the hot carriers are injected into the floating gate of the floating gate transistor M, the memory cell has the first storing state (e.g. the storing state "0"). Whereas, if no hot carriers are injected into the floating gate of the floating gate transistor M, the memory cell has the second storing state (e.g. the storing state "1").

The configuration of the memory cell for the OTP memory is shown in FIG. 1C. As shown in FIG. 1C, the memory cell comprises a select transistor T and a capacitor C, which are connected with each other in series. A control gate of the select transistor T is connected with the word line WL. A first drain/source terminal is connected with the bit line BL. A second drain/source terminal is connected with a first terminal of the capacitor C. A second terminal of the capacitor C is connected with the voltage source V1.

During the program cycle, if the dielectric layer of the capacitor C is ruptured by a large current, the capacitor C is turned into a resistor. Under this circumstance, the memory cell has the first storing state (e.g. the storing state "0"). Whereas, if the dielectric layer of the capacitor C is not ruptured by the large current, the memory cell has the second storing state (e.g. the storing state "1").

The configurations of the memory cells shown in FIGS. 1B and 1C are illustrated herein for purpose of illustration and description only. It is noted that the column decoder 130 may be applied to the MTP memory or the OTP memory with any other appropriate configurations of memory cells.

Generally, during the program cycle, the magnitude of the cell current generated by the selected memory cell is very large. Consequently, the switch transistors My1~Myn of the column decoding circuit 132 should have large sizes. For example, each of the switch transistors My1~Myn is designed to have a width of 36 μm and a channel length of 0.25 μm. Since the sizes of the switch transistors My1~Myn are very large, the voltage drop across each of the switch transistors My1~Myn is not very high while the cell current flows therethrough.

Moreover, during the read cycle, a charging action of the selected memory cell is performed by the sensing circuit 140 according to the cell current generated by the selected memory cell, and the storing state of the selected memory cell is determined by the sensing circuit 140 according to the magnitude of a charging voltage. However, since the sizes of the switch transistors My1~Myn are very large, the time period of performing the read action will be extended.

Generally, the larger-sized switch transistor has a larger parasitic capacitance. Under this circumstance, the RC time constant of the circuitry is larger, and the charging voltage is slowly increased. Consequently, the sensing circuit 140 is unable to determine the storing state of the selected memory cell in a short time. In other words, because of the column decoder 130, the read sensing speed of the sensing circuit 140 is usually unsatisfied.

SUMMARY OF THE INVENTION

The present invention provides a column decoder for a non-volatile memory. Consequently, the non-volatile memory has the high speed read sensing capability during the read cycle, and the program action during the program cycle is not adversely affected.

An embodiment of the present invention provides a non-volatile memory. The non-volatile memory includes a memory array, a row decoder, a column decoder, a write buffer and a sensing circuit. The memory array includes m×n memory cells, wherein the memory array is connected with m word lines and n bit lines. The row decoder is connected with the m word lines for activating one of the m word lines, thereby determining a selected row of n memory cells, wherein the n memory cells in the selected row are connected with the n bit lines. The column decoder includes a programming decoder and a reading decoder. The programming decoder is connected with the n bit lines. The reading decoder is connected with the n bit lines. The programming decoder is operated according to a programming control signal set. The reading decoder is operated according to a reading control signal set. The write buffer is connected with the programming decoder through a programming data line. The sensing circuit is connected with the reading decoder through a reading data line. During a program cycle, the reading control signal set is inactivated but the programming control signal set is activated, so that the programming decoder determines a selected memory cell from the selected row of n memory cells. Moreover, a cell current generated by the selected memory cell flows to the write buffer through the programming decoder and the programming data line. During a read cycle, the programming control signal set is inactivated but the reading control signal set is activated, so that the reading decoder determines the selected memory cell from the selected row of n memory cells. Moreover, the cell current generated by the selected memory cell flows to the sensing circuit through the reading decoder and the reading data line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
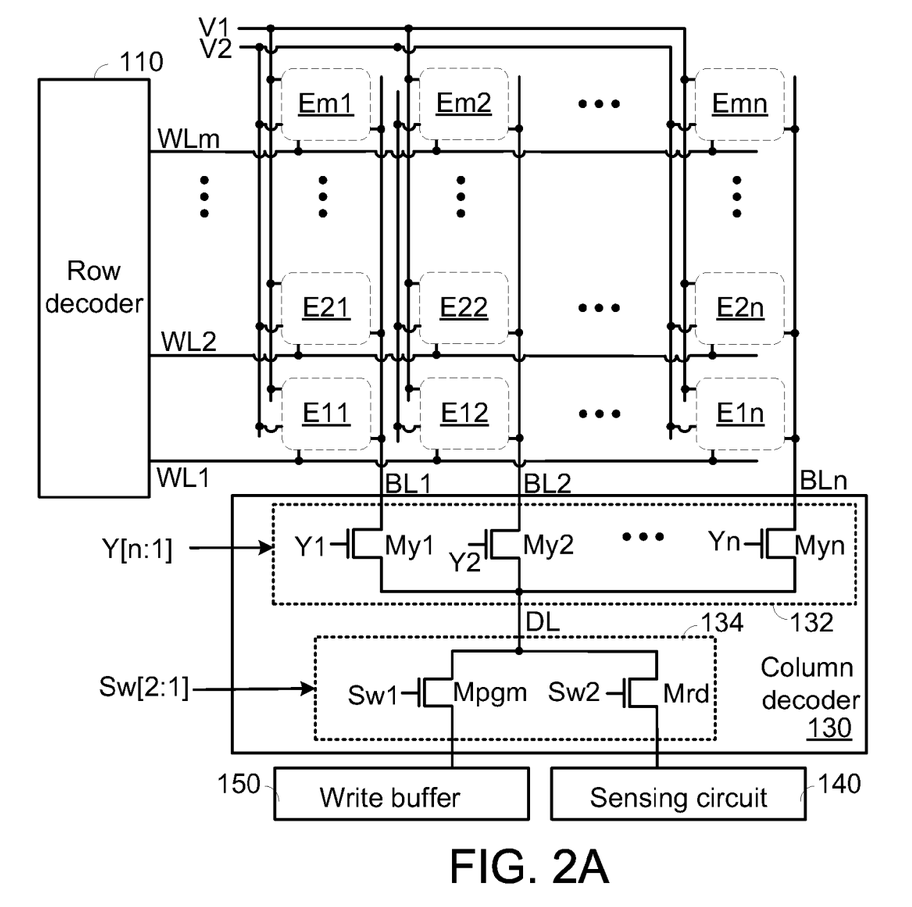
FIG. 2A is a schematic circuit diagram illustrating a conventional non-volatile memory.
Figure 2B:
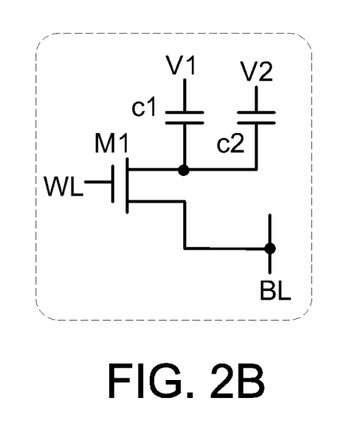
FIG. 2B is a schematic circuit diagram illustrating a memory cell of an OTP memory.
Figure 2C:
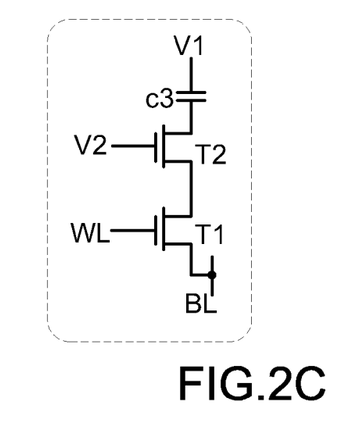
FIG. 2C is a schematic circuit diagram illustrating a memory cell of an OTP memory.

FIG. 2A is a schematic circuit diagram illustrating a non-volatile memory. FIG. 2B and FIG. 2C are schematic circuit diagrams illustrating memory cells of OTP memory. As shown in FIG. 2A, the non-volatile memory comprises a memory array, a row decoder 110, a column decoder 130, a write buffer 150 and a sensing circuit 140. The row decoder 110 is connected with m word lines WL1~WLm. The column decoder 130 is connected with n bit lines BL1~BLn. The memory array comprises m×n memory cells E11~Emn. Moreover, the memory array is connected with the m word lines WL1~WLm, the n bit lines BL1~BLn and two voltage sources V1 and V2.

Generally, the working state of the memory array may be at least divided into a program cycle and a read cycle. During the program cycle, a selected memory cell is determined by the row decoder 110 and the column decoder 130, and the voltage value of the voltage sources V1 and V2 are correspondingly adjusted. Consequently, a program action of the selected memory cell is performed. Similarly, under control of the row decoder 110 and the column decoder 130, the program actions of more selected memory cells are sequentially performed. After the program actions of all selected memory cells are completed, the program cycle is ended.

After the program cycle, each memory cell is in either a first storing state (e.g. the storing state "0") or a second storing state (e.g. the storing state "1").

During the read cycle, a selected memory cell is determined by the row decoder 110 and the column decoder 130, and the voltage values of the voltage sources V1 and V2 are correspondingly adjusted. Consequently, a read action of the selected memory cell is performed, and the storing state of the selected memory cell is determined. Similarly, under control of the row decoder 110 and the column decoder 130, the read actions of more selected memory cells are sequentially performed. After the read actions of all selected memory cells are completed, the read cycle is ended.

The configurations of the memory cells for the OTP memory are shown in FIG. 2B and FIG. 2C. As shown in FIG. 2B, the memory cell comprises a select transistor M1 and two capacitors c1 and c2. A control gate of the select transistor M1 is connected with the word line WL. A first drain/source terminal is connected with the bit line BL. A second drain/source terminal is connected with two first terminal of the capacitors c1 and c2. A second terminal of the capacitor c1 is connected with the voltage source V1, and a second terminal of the capacitor c2 is connected with the voltage source V2.

During the program cycle, if the dielectric layer of the capacitor c2 or c2 is ruptured by a large current, the capacitor c1 or c2 is turned into a resistor. Under this circumstance, the memory cell has the first storing state (e.g. the storing state "0"). Whereas, if the dielectric layers of the capacitors c1 and c2 are not ruptured by the large current, the memory cell has the second storing state (e.g. the storing state "1").

As shown in FIG. 2C, the memory cell comprises a select transistor T1, a bias transistor T2 and a capacitors c3. A control gate of the select transistor T1 is connected with the word line WL. A first drain/source terminal of the select transistor T1 is connected with the bit line BL. A control gate of the bias transistor T2 is connected with the voltage source V2. A first drain/source terminal of the bias transistor T2 is connected with a second drain/source terminal of the select transistor T1. A second drain/source terminal of the bias transistor T2 is connected with a first terminal of the capacitor c3. A second terminal of the capacitor c3 is connected with the voltage source V1.

During the program cycle, if the dielectric layer of the capacitor c3 is ruptured by a large current, the capacitor c3 is turned into a resistor. Under this circumstance, the memory cell has the first storing state (e.g. the storing state "0"). Whereas, if the dielectric layer of the capacitor c3 is not ruptured by the large current, the memory cell has the second storing state (e.g. the storing state "1").

Figure 3A:
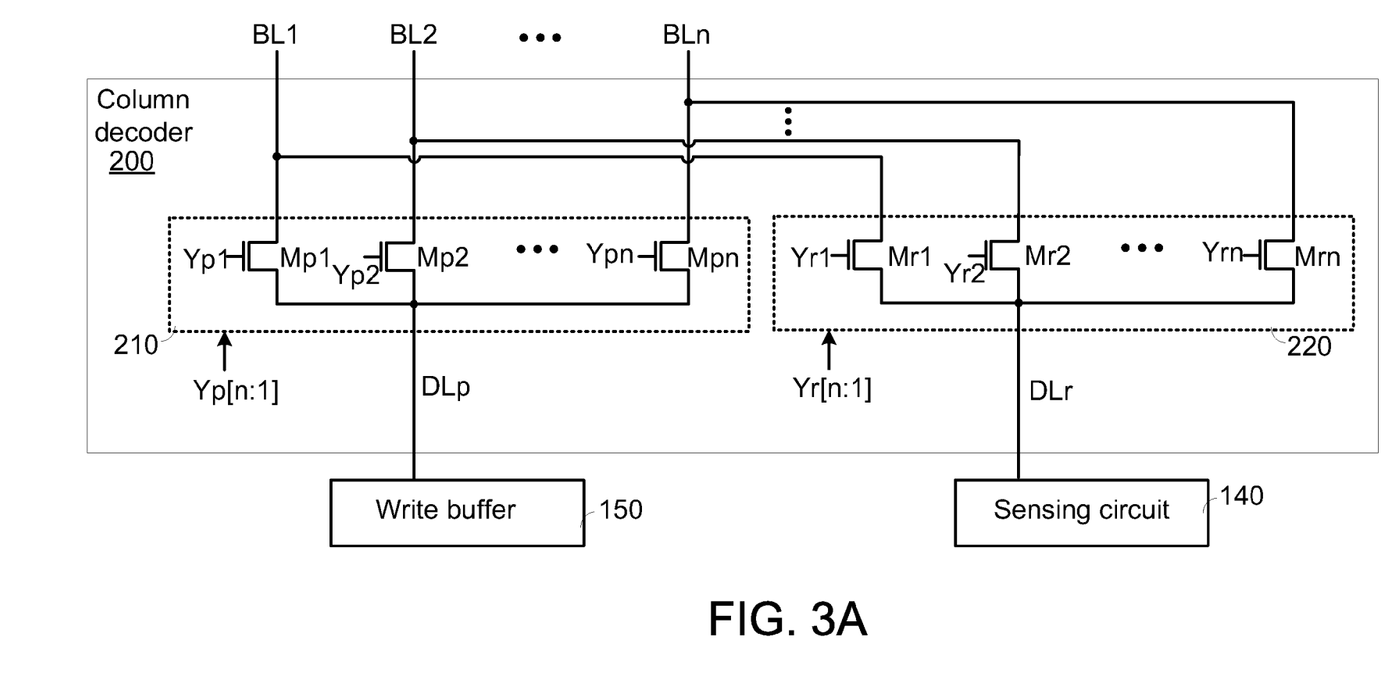
FIG. 3A is a schematic circuit diagram illustrating a column decoder for a non-volatile memory according to a first embodiment of the present invention.

FIG. 3A is a schematic circuit diagram illustrating a column decoder for a non-volatile memory according to a first embodiment of the present invention. The relationships between the memory array, the row decoder, the write buffer and the sensing circuit of the non-volatile memory and the operating principles of these components are similar to those of FIG. 1A or 2A, and are not redundantly described herein.

As shown in FIG. 3A, the column decoder 200 comprises a programming decoder 210 and a reading decoder 220. Both of the programming decoder 210 and the reading decoder 220 are connected with n bit lines BL1~BLn. The programming decoder 210 is further connected with the write buffer 150. The reading decoder 220 is further connected with the sensing circuit 140.

The programming decoder 210 is operated according to a programming control signal set Yp[n:1], and the reading decoder 220 is operated according to a reading control signal set Yr[n:1]. The programming control signal set Yp[n:1] contains n programming control signals from the first programming control signal Yp1 to the n-th programming control signal Ypn. The reading control signal set Yr[n:1] contains n reading control signals from the first reading control signal Yr1 to the n-th reading control signal Yrn.

The programming decoder 210 comprises n switch transistors Mp1~Mpn. The first terminals of the n switch transistors Mp1~Mpn are connected with the n bit lines BL1~BLn, respectively. The second terminals of the n switch transistors Mp1~Mpn are connected with a programming data line DLp. The control terminals of the n switch transistors Mp1~Mpn receive the programming control signals Yp1~Ypn, respectively. Moreover, the programming data line DLp is connected with the write buffer 150.

The reading decoder 220 comprises n switch transistors Mr1~Mrn. The first terminals of the n switch transistors Mr1~Mrn are connected with the n bit lines BL1~BLn, respectively. The second terminals of the n switch transistors Mr1~Mrn are connected with a reading data line DLr. The control terminals of the n switch transistors Mr1~Mrn receive the reading control signals Yr1~Yrn, respectively. Moreover, the reading data line DLr is connected with the sensing circuit 140.

During the program cycle of the memory array, the reading control signal set Yr[n:1] is inactivated. Moreover, according to the programming control signal set Yp[n:1], one of the n switch transistors Mp1~Mpn is in a close state but the others of the n switch transistors Mp1~Mpn are in an open state under control of the programming decoder 210. During the read cycle of the memory array, the programming control signal set Yp[n:1] is inactivated. Moreover, according to the reading control signal set Yr[n:1], one of the n switch transistors Mr1~Mrn is in the close state but the others of the n switch transistors Mr1~Mrn are in the open state under control of the reading decoder 220.

In other words, the programming decoder 210 is only enabled during the program cycle of the memory array, and the reading decoder 220 is only enabled during the read cycle of the memory array.

In this embodiment, the sizes of the n switch transistors Mp1~Mpn of the programming decoder 210 are larger than the sizes of the n switch transistors Mr1~Mrn of the reading decoder 220. For example, each of the switch transistors Mp1~Mpn is designed to have a width of 36 μm and a channel length of 0.25 μm, and each of the switch transistors Mr1~Mrn is designed to have a width of 2 μm and a channel length of 0.2 μm.

Generally, the larger-sized switch transistors Mp1~Mpn have larger parasitic capacitance values, and the smaller-sized switch transistors Mr1~Mrn have smaller parasitic capacitance values. During the read cycle of the memory array, the cell current generated by the selected memory cell flows through one of the small-sized switch transistor Mr1~Mrn of the reading decoder 220. Under this circumstance, the RC time constant of the circuitry is smaller. Consequently, the sensing circuit 140 can quickly determine the storing state of the selected memory cell. In other words, the high speed read sensing capability is achieved.

During the program cycle, the reading decoder 220 of the column decoder 200 is disabled. Moreover, according to the programming control signal set Yp[n:1], the programming decoder 210 determines a selected memory cell from the selected row of n memory cells. Consequently, during the program cycle, the cell current generated by the selected memory cell flows to the write buffer 150 through one of the switch transistors Mp1~Mpn and the programming data line DLp. Meanwhile, the program action of the selected memory cell is completed.

In other words, during the program cycle, the magnitude of the cell current generated by the selected memory cell is very large. Since the sizes of the Mp1~Mpn are very large, the voltage drop across each of the switch transistors Mp1~Mpn is not very high while the cell current flows therethrough.

During the read cycle, the programming decoder 210 of the column decoder 200 is disabled. Moreover, according to the reading control signal set Yr[n:1], the reading decoder 220 determines a selected memory cell from the selected row of n memory cells. Consequently, during the read cycle, the cell current generated by the selected memory cell flows to the sensing circuit 140 through one of the switch transistors Mr1~Mrn and the reading data line DLr. Meanwhile, the read action of the selected memory cell is completed.

In other words, during the read cycle, the cell current generated by the selected memory cell flows through one of the switch transistors Mr1~Mrn. Since the switch transistors Mr1~Mrn have smaller parasitic capacitance values, the sensing circuit 140 can quickly determine the storing state of the selected memory cell.

Hereinafter, a process of programming the memory cell C22 and a process of reading the memory cell C22 will be illustrated as examples. During the program cycle, the row decoder (not shown) activates the word line WL2 to determine a selected row of n memory cells C21~C2n. Moreover, if the second programming control signal Yp2 is activated but the other programming control signals Yp1 and Yp3~Ypn are inactivated, the switch transistor Mp2 is in the close state but the other switch transistors Mp1 and Mp3~Mpn are in the open state under control of the programming decoder 210 of the column decoder 200. Consequently, the memory cell C22 is the selected memory cell. During the program cycle, the cell current generated by the selected memory cell C22 flows to the write buffer 150 through the switch transistor Mp2 and the programming data line DLp. Meanwhile, the program action of the selected memory cell C22 is completed.

During the read cycle, the row decoder (not shown) activates the word line WL2 to determine a selected row of n memory cells C21~C2n. Moreover, if the second reading control signal Yr2 is activated but the other reading control signals Yr1 and Yr3~Yrn are inactivated, the switch transistor Mr2 is in the close state but the other switch transistors Mr1 and Mr3~Mrn are in the open state under control of the reading decoder 220 of the column decoder 200. Consequently, the memory cell C22 is the selected memory cell. During the read cycle, the cell current generated by the selected memory cell C22 flows to the sensing circuit 140 through the switch transistor Mr2 and the reading data line DLr. Meanwhile, the sensing circuit 140 determines the storing state of the selected memory cell according to the cell current.

In particular, the sensing circuit 140 determines the storing state of the selected memory cell according to the charging voltage of the reading data line DLr. Consequently, before the storing state of the selected memory cell is determined, the voltage of the reading data line DLr is adjusted to a reference voltage (e.g. a ground voltage). Then, the reading data line DLr is charged from the reference voltage by using the cell current of the selected memory cell.

Figure 3B:
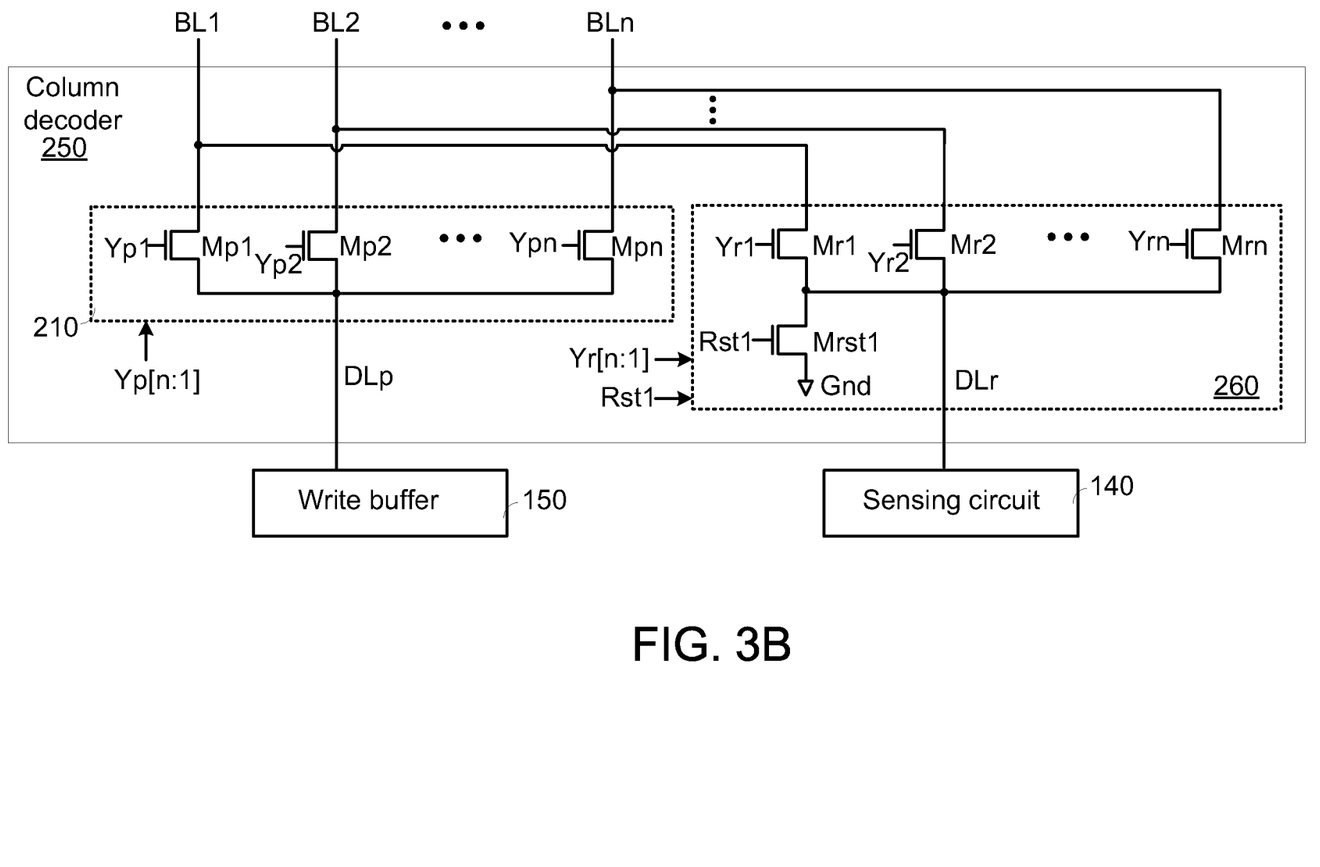
FIG. 3B is a schematic circuit diagram illustrating a column decoder for a non-volatile memory according to a second embodiment of the present invention.

FIG. 3B is a schematic circuit diagram illustrating a column decoder for a non-volatile memory according to a second embodiment of the present invention. As shown in FIG. 3B, the column decoder 210 comprises a programming decoder 210 and a reading decoder 260. In comparison with the first embodiment, the reading decoder 260 of this embodiment further comprises a reset transistor Mrst1. The reset transistor Mrst1 is connected between the reading data line DLr and a ground voltage Gnd. The configurations and the operating principles of the programming decoder 210 are similar to those of FIG. 3A, and are not redundantly described herein.

The reading decoder 260 is operated according to a reading control signal set Yr[n:1] and a reset signal Rst1. The reading control signal set Yr[n:1] contains n reading control signals from the first reading control signal Yr1 to the n-th reading control signal Yrn.

The reading decoder 260 comprises n switch transistors Mr1~Mrn. The first terminals of the n switch transistors Mr1~Mrn are connected with the n bit lines BL1~BLn, respectively. The second terminals of the n switch transistors Mr1~Mrn are connected with a reading data line DLr. The control terminals of the n switch transistors Mr1~Mrn receive the reading control signals Yr1~Yrn, respectively. A first terminal of the reset transistor Mrst1 is connected with the reading data line DLr. A second terminal of the reset transistor Mrst1 is connected to the ground voltage Gnd. A control terminal of the reset transistor Mrst1 receives the reset signal Rst1.

During the read cycle of the memory array, the reset signal Rst1 is shortly activated. Consequently, the voltage of the reading data line DLr is adjusted to the ground voltage Gnd. Then, according to the reading control signal set Yr[n:1], one of the n switch transistors Mr1~Mrn is in the close state but the others of the n switch transistors Mr1~Mrn are in the open state under control of the reading decoder 260. Consequently, the reading data line DLr is charged by using the cell current of the selected memory cell, and the voltage of the reading data line DLr is gradually increased from the ground voltage Gnd. According to the voltage change of the reading data line DLr, the sensing circuit 140 determines the storing state of the selected memory cell. Meanwhile, the read action of the selected memory cell is completed.

Similarly, the sizes of the n switch transistors Mp1~Mpn of the programming decoder 210 are larger than the sizes of the n switch transistors Mr1~Mrn of the reading decoder 220. Consequently, the sensing circuit 140 can quickly determine the storing state of the selected memory cell.

Figure 4A:
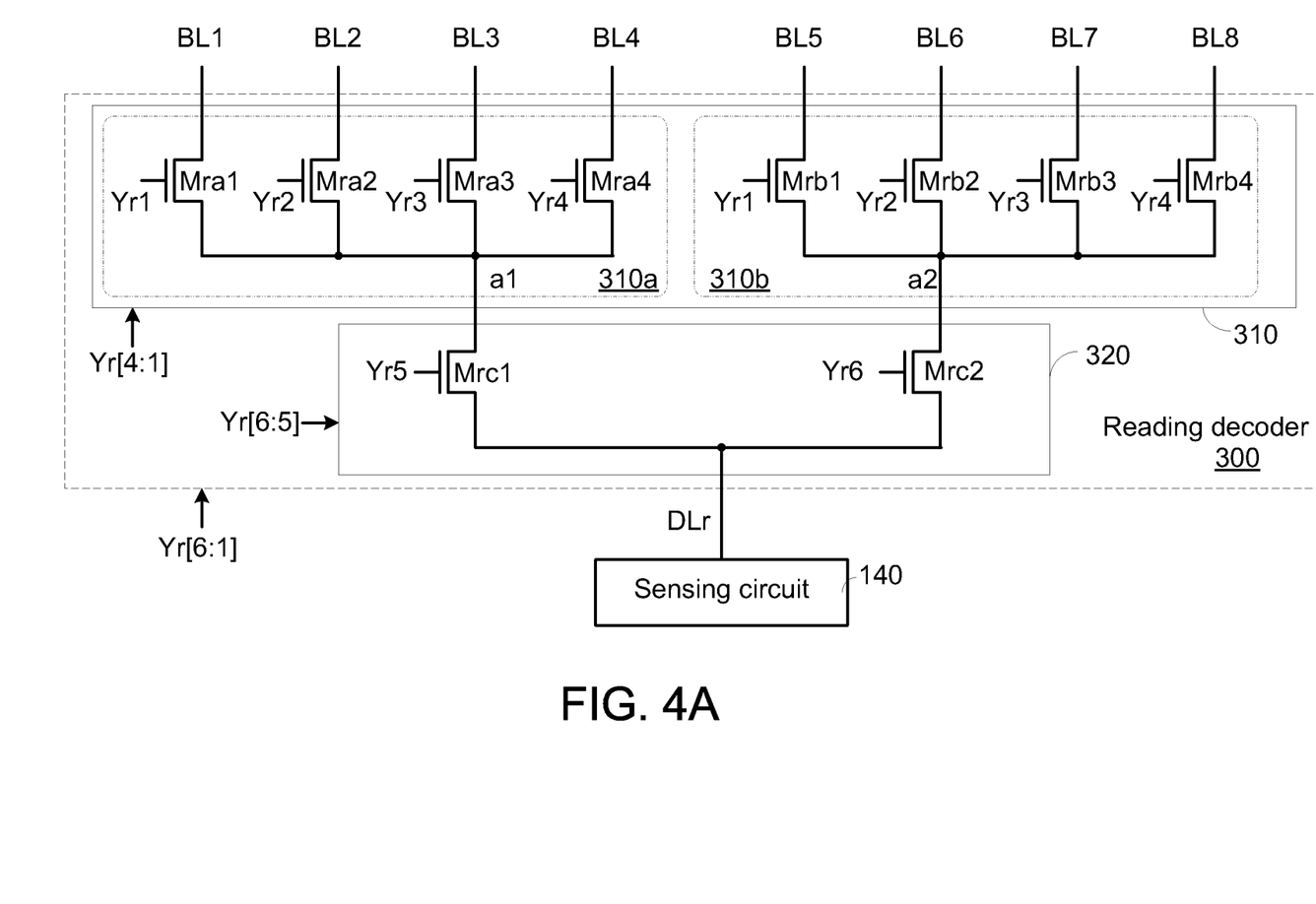
FIG. 4A is a schematic circuit diagram illustrating a reading decoder of a column decoder according to a third embodiment of the present invention.

Moreover, the reading decoder of the present invention may be modified to have a tree structure. FIG. 4A is a schematic circuit diagram illustrating a reading decoder of a column decoder according to a third embodiment of the present invention. In this embodiment, the reading decoder 300 is connected with eight bit lines BL1~BL8. It is noted that the number of the bit lines is not restricted. The configurations and the operating principles of the programming decoder of the column decoder are similar to those of FIG. 3A, and are not redundantly described herein.

As shown in FIG. 4A, the reading decoder 300 comprises a first stage decoding circuit 310 and a second stage decoding circuit 320.

The first stage decoding circuit 310 has eight input terminals and two output terminals. The eight input terminals are connected with the eight bit lines BL1~BL8, respectively. The first stage decoding circuit 310 comprises a first decoding unit 310a and a second decoding unit 310b. The first decoding unit 310a is controlled according to four (i.e. 8/2=4) reading control signals Yr1~Yr4, respectively. Similarly, the second decoding unit 310b is also controlled according to the four reading control signals Yr1~Yr4, respectively.

The first decoding unit 310a comprises four switch transistors Mra1~Mra4. The first terminals of the four switch transistors Mra1~Mra4 are connected with the four bit lines BL1~BL4, respectively. The second terminals of the four switch transistors Mra1~Mra4 are connected with a first node a1. The control terminals of the four switch transistors Mra1~Mra4 receive the reading control signals Yr1~Yr4, respectively.

The second decoding unit 310b comprises four switch transistors Mrb1~Mrb4. The first terminals of the four switch transistors Mrb1~Mrb4 are connected with the four bit lines BL5~BL8, respectively. The second terminals of the four switch transistors Mrb1~Mrb4 are connected with a second node a2. The control terminals of the four switch transistors Mrb1~Mrb4 receive the reading control signals Yr1~Yr4, respectively.

The second stage decoding circuit 320 has two input terminals and one output terminal. The second stage decoding circuit 320 is controlled according to two reading control signals Yr5 and Yr6, respectively. The second stage decoding circuit 320 comprises two switch transistors Mrc1 and Mrc2. The first terminals of the two switch transistors Mrc1 and Mrc2 are connected with the first node a1 and the second node a2, respectively. The second terminals of the two switch transistors Mrc1 and Mrc2 are connected with a reading data line DLr. The control terminals of the two switch transistors Mrc1 and Mrc2 receive the reading control signals Yr5 and Yr6, respectively. Moreover, the reading data line DLr is connected with the sensing circuit 140.

In this embodiment, the sizes of the switch transistors Mrc1 and Mrc2 of the second stage decoding circuit 320 of the reading decoder 300 are smaller than the sizes of the switch transistors Mra1~Mra4 and Mrb1~Mrb4 of the first stage decoding circuit 310. For example, each of the switch transistors Mra1~Mra4 and Mrb1~Mrb4 is designed to have a width of 2 μm and a channel length of 0.2 μm, and each of the switch transistors Mrc1 and Mrc2 is designed to have a width of 1 μm and a channel length of 0.2 μm.

Hereinafter, a process of programming the memory cell C22 and a process of reading the memory cell C22 will be illustrated as examples. During the read cycle, the row decoder (not shown) activates the word line WL2 to determine a selected row of n memory cells C21~C2n. Moreover, if the second reading control signal Yr2 of the first stage decoding circuit 310 is activated but the other reading control signals Yr1, Yr3 and Yr4 are inactivated, the switch transistor Mra2 of the first decoding unit 310a is in the close state but the other switch transistors Mra1, Mra3 and Mra4 are in the open state; and the switch transistor Mrb2 of the second decoding unit 310b is in the close state but the other switch transistors Mrb1, Mrb3 and Mrb4 are in the open state.

Moreover, if the fifth reading control signal Yr5 of the second stage decoding circuit 320 is activated but the sixth reading control signal Yr6 is inactivated, the switch transistor Mrc1 of the second stage decoding circuit 320 is in the close state but the switch transistor Mrc2 is in the open state. Consequently, the memory cell C22 is the selected memory cell. During the read cycle, the cell current generated by the selected memory cell C22 flows to the sensing circuit 140 through the switch transistors Mra2, the switch transistor Mrc1 and the reading data line DLr. Meanwhile, the sensing circuit 140 determines the storing state of the selected memory cell according to the cell current.

Since all of the switch transistors Mra1~Mra4, Mrb1~Mrb4, Mrc1 and Mrc2 of the reading decoder 300 have smaller sizes, the sensing circuit 140 can quickly determine the storing state of the selected memory cell.

Figure 4B:
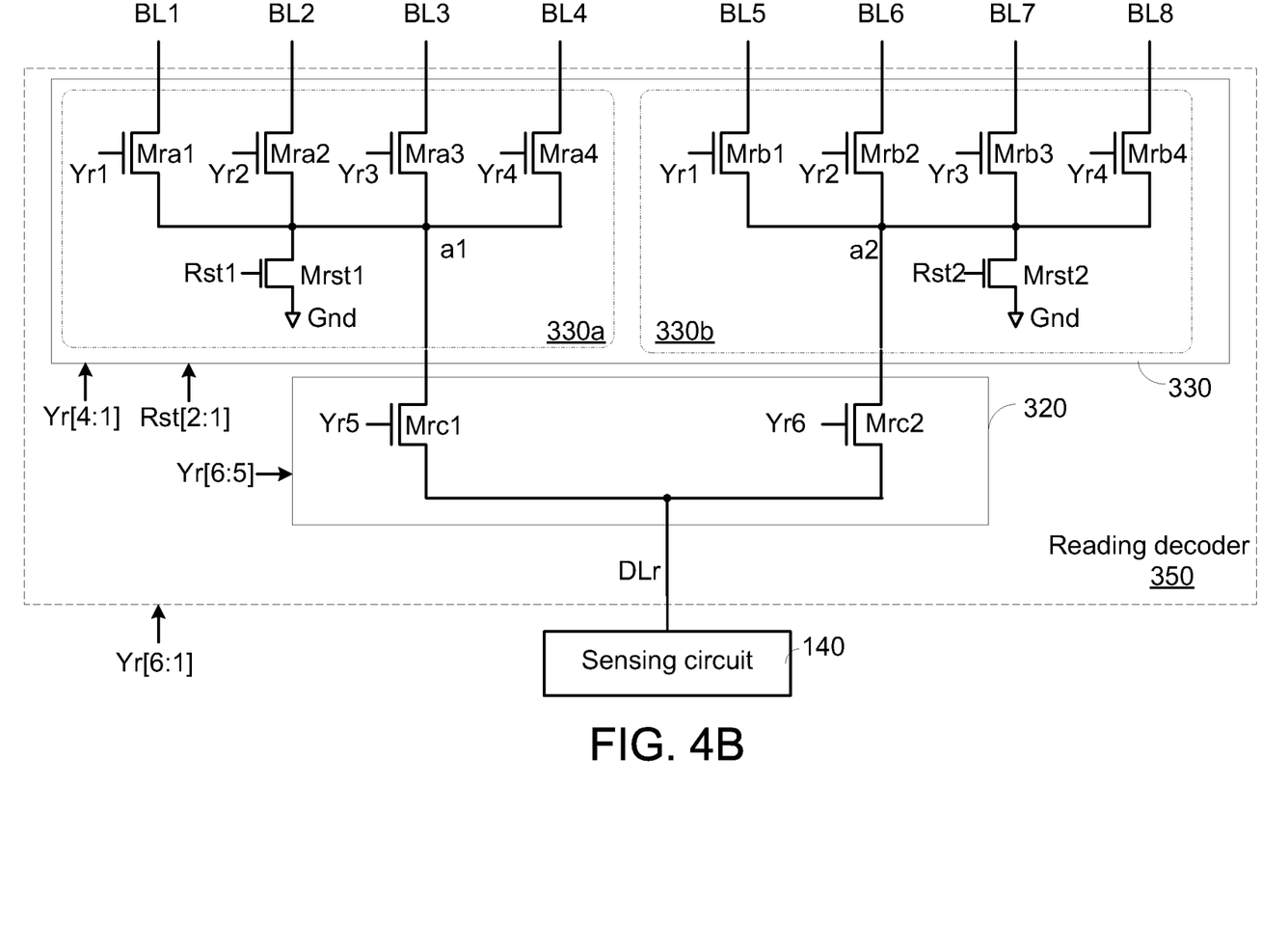
FIG. 4B is a schematic circuit diagram illustrating a reading decoder of a column decoder according to a fourth embodiment of the present invention.

FIG. 4B is a schematic circuit diagram illustrating a reading decoder of a column decoder according to a fourth embodiment of the present invention. As shown in FIG. 4B, the reading decoder 350 comprises a first stage decoding circuit 330 and a second stage decoding circuit 320. The first stage decoding circuit 330 comprises a first decoding unit 330a and a second decoding unit 330b. In comparison with FIG. 4A, the first decoding unit 330a and the second decoding unit 330b of the first stage decoding circuit 330 of this embodiment further comprises reset transistors Mrst1 and Mrst2, respectively. The reset transistor Mrst1 is connected between the first node a1 and a ground voltage Gnd. The reset transistor Mrst2 is connected between the second node a2 and the ground voltage Gnd. The configurations and the operating principles of the second stage decoding circuit 320 are similar to those of FIG. 4A, and are not redundantly described herein.

The first stage decoding circuit 330 is operated according to a reading control signal set Yr[4:1] and a reset signal set Rst[2:1]. The reset signal set Rst[2:1] contains a first reset signal Rst1 and a second rest signal Rst2.

The first decoding unit 330a comprises four switch transistors Mra1~Mra4. The first terminals of the four switch transistors Mra1~Mra4 are connected with the four bit lines BL1~BL4, respectively. The second terminals of the four switch transistors Mra1~Mra4 are connected with a first node a1. The control terminals of the four switch transistors Mra1~Mra4 receive the reading control signals Yr1~Yr4, respectively. A first terminal of the reset transistor Mrst1 is connected with the first node a1. A second terminal of the reset transistor Mrst1 is connected to the ground voltage Gnd. A control terminal of the reset transistor Mrst1 receives the first reset signal Rst1.

The second decoding unit 330b comprises four switch transistors Mrb1~Mrb4. The first terminals of the four switch transistors Mrb1~Mrb4 are connected with the four bit lines BL5~BL8, respectively. The second terminals of the four switch transistors Mrb1~Mrb4 are connected with a second node a2. The control terminals of the four switch transistors Mrb1~Mrb4 receive the reading control signals Yr1~Yr4, respectively. A first terminal of the reset transistor Mrst2 is connected with the second node a2. A second terminal of the reset transistor Mrst2 is connected to the ground voltage Gnd. A control terminal of the reset transistor Mrst2 receives the second reset signal Rst2.

During the read cycle of the memory array, the first reset signal Rst1 or the second rest signal Rst2 is shortly activated. Consequently, the voltage of the reading data line DLr is adjusted to the ground voltage Gnd. Then, according to the reading control signal set Yr[6:1], the cell current generated by the selected memory cell flows to the sensing circuit 140. Consequently, the sensing circuit 140 determines the storing state of the selected memory cell.

Figure 5A:
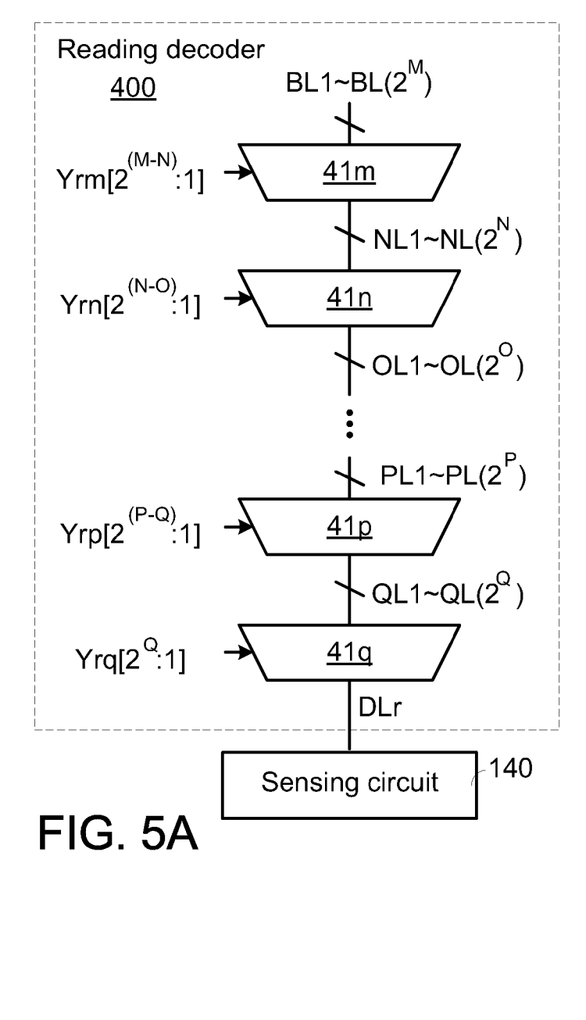
FIG. 5A is a schematic circuit diagram illustrating a reading decoder of a column decoder according to a fifth embodiment of the present invention.

Moreover, the reading decoder of the present invention may be modified to have a tree structure with more stages of decoding circuits. FIG. 5A is a schematic circuit diagram illustrating a reading decoder of a column decoder according to a fifth embodiment of the present invention. In this embodiment, the reading decoder 400 is connected with $2^M$ bit lines BL1~BL($2^M$). Moreover, the reading decoder 400 comprises multiple stages of decoding circuits 41m, 41n, 41p, . . . , and 41q.

The decoding circuit 41m has $2^M$ input terminals and $2^N$ output terminals NL1~NL($2^N$). The $2^M$ input terminals are connected with the $2^M$ bit lines BL1~BL($2^M$), respectively. The decoding circuit 41m comprises $2^M$ switch transistors. The $2^M$ switch transistors are connected with the $2^M$ input terminals (i.e. the $2^M$ bit lines BL1~BL($2^M$)), respectively. Moreover, the $2^M$ switch transistors are evenly included in $2^N$ decoding units. Consequently, each decoding unit contains $2^{(M-N)}$ switch transistors. Moreover, the $2^{(M-N)}$ switch transistors of each decoding unit are respectively controlled according to $2^{(M-N)}$ reading control signals of a reading control signal set Yrm[$2^{(M-N)}$:1]. During the read cycle, only one reading control signal of the reading control signal set Yrm[$2^{(M-N)}$:1] is activated. Moreover, the $2^N$ decoding units are also connected with the $2^N$ output terminals NL1~NL($2^N$), respectively.

The decoding circuit 41n is connected with the previous stage decoding circuit 41m. The decoding circuit 41n has $2^N$ input terminals NL1~NL($2^N$) and $2^O$ output terminals OL1~OL($2^O$). The decoding circuit 41n comprises $2^N$ switch transistors. The $2^N$ switch transistors are connected with the $2^N$ input terminals NL1~NL($2^N$), respectively. Moreover, the $2^N$ switch transistors are evenly included in $2^O$ decoding units. Consequently, each decoding unit contains $2^{(N-O)}$ switch transistors. Moreover, the $2^{(N-O)}$ switch transistors of each decoding unit are respectively controlled according to $2^{(N-O)}$ reading control signals of a reading control signal set Yrn[$2^{(N-O)}$:1]. During the read cycle, only one reading control signal of the reading control signal set) Yrn[$2^{(N-O)}$:1] is activated. Moreover, the $2^O$ decoding units are also connected with the $2^O$ output terminals OL1~OL($2^O$), respectively.

After the conversion of at least one decoding circuit, the original $2^M$ input terminals of the decoding circuit 41m which are connected with the $2^M$ bit lines BL1~BL($2^M$) are reduced to the $2^P$ input terminals PL1~PL($2^P$) of the penultimate stage decoding circuit 41p. In particular, the decoding circuit 41p has $2^P$ input terminals PL1~PL($2^P$) and $2^Q$ output terminal QL1~QL($2^Q$). The decoding circuit 41p comprises $2^P$ switch transistors. The $2^P$ switch transistors are connected with the $2^P$ input terminals PL1~PL($2^P$), respectively. Moreover, the $2^P$ switch transistors are evenly included in $2^Q$ decoding units. Consequently, each decoding unit contains $2^{(P-Q)}$ switch transistors. Moreover, the $2^{(P-Q)}$ switch transistors of each decoding unit are respectively controlled according to $2^{(P-Q)}$ reading control signals of a reading control signal set Yrp[$2^{(P-Q)}$:1]. During the read cycle, only one reading control signal of the reading control signal set Yrp[$2^{(P-Q)}$:1] is activated. Moreover, the $2^Q$ decoding units are also connected with the $2^Q$ output terminals OL1~OL($2^Q$), respectively.

The last decoding circuit 41q is connected with the previous stage decoding circuit 41p. The decoding circuit 41q has $2^Q$ input terminals OL1~OL($2^Q$) and one output terminal. The output terminal of the decoding circuit 41q is connected with a reading data line DLr. The decoding circuit 41q comprises $2^Q$ switch transistors. The $2^Q$ switch transistors are connected with the $2^Q$ input terminals OL1~OL($2^Q$), respectively. Moreover, the $2^Q$ switch transistors are included in one decoding unit. Consequently, each decoding unit contains $2^Q$ switch transistors. Moreover, the $2^Q$ switch transistors of each decoding unit are respectively controlled according to $2^Q$ reading control signals of a reading control signal set Yrq[$2^Q$:1]. During the read cycle, only one reading control signal of the reading control signal set Yrq[$2^Q$:1] is activated. Moreover, the last decoding unit 41q is also connected with the reading data line DLr. Moreover, the reading data line DLr is connected with the sensing circuit 140.

As mentioned above, during the read cycle, the cell current generated by the selected memory cell flows to the sensing circuit 140 through the multiple stages of decoding circuits 41m, 41n, 41p, 41q and the reading data line DLr sequentially according to the reading control signal sets Yrm[$2^{(M-N)}$:1], Yrn[$2^{(N-O)}$:1], Yrp[$2^{(P-Q)}$:1] and Yrq[$2^Q$:1]. Consequently, the sensing circuit 140 determines the storing state of the selected memory cell according to the cell current.

Moreover, the sizes of all switch transistors of the reading decoder 400 are smaller than the sizes of all switch transistors of the programming decoder, wherein M>N>O>P>Q and M, N, O, P and Q are positive integers.

The configurations of the reading decoder 400 are presented herein for purpose of illustration and description only. It is noted that numerous modifications and alterations may be made while retaining the teachings of the invention. For example, the two decoding circuits 41p and 41q may be combined as a two-stage reading decoder. Under this circumstance, all bit lines are connected with the $2^P$ input terminals PL1~PL($2^P$) of the decoding circuit 41p and controlled according to the reading control signal set Yrp[$2^{(P-Q)}$:1]. The $2^Q$ output terminal QL1~QL($2^Q$) are connected with the decoding circuit 41q and controlled according to the reading control signal set Yrp[$2^Q$:1]. The output terminal of the decoding circuit 41q is connected with the reading data line DLr.

Figure 5B:
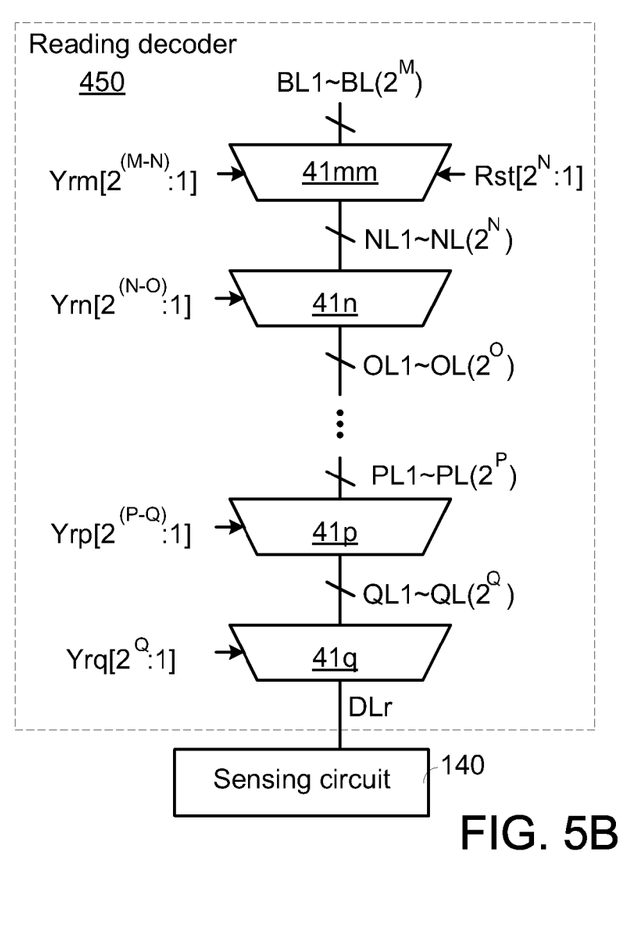
FIG. 5B is a schematic circuit diagram illustrating a reading decoder of a column decoder according to a sixth embodiment of the present invention.

FIG. 5B is a schematic circuit diagram illustrating a reading decoder of a column decoder according to a sixth embodiment of the present invention. In comparison with FIG. 5A, each of the $2^N$ decoding units of the first stage decoding circuit 41mm of the reading decoder 450 further comprises reset transistor. In other words, the first stage decoding circuit 41mm contains $2^N$ switch transistors. The $2^N$ switch transistors are connected between the $2^N$ output terminals NL1~NL($2^N$) and the ground voltage Gnd. Moreover, the $2^N$ switch transistors are respectively connected according to $2^N$ reset signals of a reset signal set Rst[$2^N$:1]. The configurations and the operating principles of the other decoding circuits 41n, 41p and 41q are similar to those of FIG. 5A, and are not redundantly described herein.

From the above descriptions, the present invention provides a column decoder for a non-volatile memory. Consequently, the non-volatile memory has the high speed read sensing capability during the read cycle, and the program action during the program cycle is not adversely affected.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
   a memory array comprising m×n memory cells, wherein the memory array is connected with m word lines and n bit lines;
   a row decoder connected with the m word lines for activating one of the m word lines, thereby determining a selected row of n memory cells, wherein the n memory cells in the selected row are connected with the n bit lines;
   a column decoder comprising a programming decoder and a reading decoder, wherein the programming decoder includes n input terminals directly connected with the n bit lines and an output terminal connected with a programming data line, and the reading decoder includes n input terminals directly connected with the n bit lines and an output terminal connected with a reading data line, wherein the programming decoder is operated according to a programming control signal set, and the reading decoder is operated according to a reading control signal set;
   a write buffer directly connected with the programming decoder through the programming data line; and
   a sensing circuit directly connected with the reading decoder through the reading data line,
   wherein during a program cycle, the reading control signal set is inactivated but the programming control signal set is activated, so that the programming decoder determines a selected memory cell from the selected row of n memory cells, wherein a cell current generated by the selected memory cell flows to the write buffer through the programming decoder and the programming data line,
   wherein during a read cycle, the programming control signal set is inactivated but the reading control signal set is activated, so that the reading decoder determines the selected memory cell from the selected row of n memory cells, wherein the cell current generated by the selected memory cell flows to the sensing circuit through the reading decoder and the reading data line.

2. The non-volatile memory as claimed in claim 1, wherein the programming control signal set contains n programming control signals, and the programming decoder comprises n first switch transistors, wherein first terminals of the n first switch transistors are respectively connected with the n bit lines, second terminals of the n first switch transistors are connected with the programming data line, and control terminals of the n first switch transistors receive the n programming control signals, respectively.

3. The non-volatile memory as claimed in claim 2, wherein the reading control signal set contains n reading control signals, and the reading decoder comprises n second switch transistors, wherein first terminals of the n second switch transistors are respectively connected with the n bit lines, second terminals of the n second switch transistors are connected with the reading data line, and control terminals of the n second switch transistors receive the n reading control signals, respectively.

4. The non-volatile memory as claimed in claim 3, wherein the reading decoder further comprises a reset transistor, wherein a first terminal of the reset transistor is connected with the reading data line, a second terminal of the reset transistor is connected with a reference voltage, and a control terminal of the reset transistor receives a reset signal.

5. The non-volatile memory as claimed in claim 3, wherein a size of each first switch transistor is larger than a size of each second switch transistor.

6. The non-volatile memory as claimed in claim 1, wherein during the read cycle, the sensing circuit determines a storing state of the selected memory cell according to the cell current.

7. The non-volatile memory as claimed in claim 1, wherein a first memory cell of the memory array includes:
   a select transistor, having a control gate connected with a first word line, and a first drain/source terminal connected with a first bit line;
   a first capacitor, having a first terminal connected with a second drain/source terminal of the select transistor, and a second terminal connected with a first voltage source; and
   a second capacitor, having a first terminal connected with the second drain/source terminal of the select transistor, and a second terminal connected with a second voltage source.

8. The non-volatile memory as claimed in claim 1, wherein a first memory cell of the memory array includes:
   a select transistor, having a control gate connected with a first word line, and a first drain/source terminal connected with a first bit line;
   a capacitor, having a first terminal connected with a first voltage source; and
   a bias transistor, having a control gate connected with a second voltage source, a first drain/source terminal connected with a second drain/source terminal of the select transistor, and a second drain/source terminal connected with a second terminal of the capacitor.

9. The non-volatile memory as claimed in claim 1, wherein n is equal to $2^P$, and the reading decoder comprises:
   a first stage decoding circuit having $2^P$ input terminals and $2^Q$ output terminals, wherein the $2^P$ input terminals are respectively connected with the n bit lines, the first stage decoding circuit comprises $2^Q$ decoding units, and the $2^Q$ decoding units are controlled according to a first reading control signal set; and
   a second stage decoding circuit having $2^Q$ input terminals and one output terminal, wherein the $2^Q$ input terminals of the second stage decoding circuit are respectively connected with the $2^Q$ output terminals of the first stage decoding circuit, and the output terminal of the second stage decoding circuit is connected with the reading data line, wherein the second stage decoding circuit is controlled according to a second reading control signal set, wherein the first reading control signal set contains $2^{(P-Q)}$ reading control signals, and the second reading control signal set contains $2^Q$ reading control signals, wherein P is larger than Q, and P and Q are positive integers.

10. The non-volatile memory as claimed in claim 9, wherein the first stage decoding circuit comprises $2^Q$ reset transistors, wherein first terminals of the $2^Q$ reset transistors are respectively connected with the $2^Q$ output terminals of the first stage decoding circuit, second terminals of the $2^Q$ reset transistors are connected with a reference voltage, and the $2^Q$ reset transistors are controlled according to $2^Q$ reset signals, respectively.

11. The non-volatile memory as claimed in claim 9, wherein the first stage decoding circuit comprises $2^P$ first switch transistors, and the $2^P$ first switch transistors are evenly included in the $2^Q$ decoding units, so that each of the $2^Q$ decoding units contains $2^{(P-Q)}$ first switch transistors, wherein the $2^{(P-Q)}$ first switch transistors are controlled according to the first reading control signal set, and the $2^Q$ decoding units are respectively connected with the $2^Q$ output terminals of the first stage decoding circuit.

12. The non-volatile memory as claimed in claim 11, wherein the second stage decoding circuit comprises $2^Q$ second switch transistors, wherein first terminals of the $2^Q$ second switch transistors are respectively connected with the $2^Q$ input terminals of the second stage decoding circuit, second terminals of the $2^Q$ second switch transistors are connected with the reading data line, and the $2^Q$ second switch transistors are controlled according to the second reading control signal set.

13. The non-volatile memory as claimed in claim 12, wherein a size of each first switch transistor is larger than a size of each second switch transistor.

14. The non-volatile memory as claimed in claim 1, wherein n is equal to $2^M$, and the reading decoder comprises:

at least one first stage decoding circuit having $2^M$ input terminals and $2^P$ output terminals, wherein the $2^M$ input terminals are respectively connected with the n bit lines;

a penultimate stage decoding circuit having $2^P$ input terminals and $2^Q$ output terminals, wherein the $2^P$ input terminals of the penultimate stage decoding circuit are respectively connected with the $2^P$ output terminals of the at least one first stage decoding circuit, the penultimate stage decoding circuit comprises $2^Q$ decoding units, and the $2^Q$ decoding units are controlled according to a first reading control signal set; and a last stage decoding circuit having $2^Q$ input terminals and one output terminal, wherein the $2^Q$ input terminals of the last stage decoding circuit are respectively connected with the $2^Q$ output terminals of the penultimate stage decoding circuit, and the output terminal of the last stage decoding circuit is connected with the reading data line, wherein the last stage decoding circuit is controlled according to a second reading control signal set, wherein the first reading control signal set contains $2^{(P-Q)}$ reading control signals, and the second reading control signal set contains $2^Q$ reading control signals, wherein M is larger than P, P is larger than Q, and M, P and Q are positive integers.

15. The non-volatile memory as claimed in claim 14, wherein the penultimate stage decoding circuit comprises $2^P$ first switch transistors, and the $2^P$ first switch transistors are evenly included in the $2^Q$ decoding units, so that each of the $2^Q$ decoding units contains $2^{(P-Q)}$ first switch transistors, wherein the $2^{(P-Q)}$ first switch transistors are controlled according to the first reading control signal set, and the $2^Q$ decoding units are respectively connected with the $2^Q$ output terminals of the first stage decoding circuit.

16. The non-volatile memory as claimed in claim 15, wherein the last stage decoding circuit comprises $2^Q$ second switch transistors, wherein first terminals of the $2^Q$ second switch transistors are respectively connected with the $2^Q$ input terminals of the last stage decoding circuit, second terminals of the $2^Q$ second switch transistors are connected with the reading data line, and the $2^Q$ second switch transistors are controlled according to the second reading control signal set.

* * * * *